US009680424B2

(12) United States Patent
Chiu

(10) Patent No.: US 9,680,424 B2
(45) Date of Patent: Jun. 13, 2017

(54) POWER AMPLIFIER WITHOUT A TRANSFORMER

(71) Applicant: Jin Tai De Technology Co., Ltd., Pingtung County (TW)

(72) Inventor: Pai-Shih Chiu, Pingtung County (TW)

(73) Assignee: JIN TAI DE TECHNOLOGY CO., LTD., Pingtung (TW)

( * ) Notice: Subject to any disclaimer, the term of this patent is extended or adjusted under 35 U.S.C. 154(b) by 0 days.

(21) Appl. No.: 14/992,108

(22) Filed: Jan. 11, 2016

(65) Prior Publication Data

US 2016/0352291 A1 Dec. 1, 2016

(51) Int. Cl.

*H03F 1/52* (2006.01)
*H03F 3/183* (2006.01)
*H03F 3/21* (2006.01)
*H03F 3/08* (2006.01)

(52) U.S. Cl.

CPC ............... *H03F 1/52* (2013.01); *H03F 3/085* (2013.01); *H03F 3/183* (2013.01); *H03F 3/21* (2013.01); *H03F 2200/03* (2013.01); *H03F 2200/114* (2013.01); *H03F 2200/165* (2013.01)

(58) Field of Classification Search

CPC .. H03F 2200/03; H03F 2200/276; H03F 1/52; H03F 1/523
USPC ................................ 330/59, 297, 207 P, 298
See application file for complete search history.

(56) References Cited

U.S. PATENT DOCUMENTS 6,437,648 B1 * 8/2002 Van Beylen .......... H03F 3/3074 330/297

* cited by examiner

*Primary Examiner* — Steven J Mottola
(74) *Attorney, Agent, or Firm* — Jackson IPG PLLC; Demian K. Jackson

(57) ABSTRACT

A power amplifier without transformer includes an audio isolator, a phase detector, a power protection controller, a rectifier and an amplifier. The audio isolator is used to isolate audio-source input end and the amplifier for making the amplifier directly connected to utility power via the rectifier without transformer to increase transformation efficiency and decrease weight and bulk of the power amplifier substantially. The phase detector is used to detect utility power phase whether correct. The power protection controller is used to determine utility power whether supply to the amplifier for preventing the amplifier from broken caused by excessive current.

20 Claims, 7 Drawing Sheets

POWER AMPLIFIER WITHOUT A TRANSFORMER

FIELD OF THE INVENTION

The present invention relates to a power amplifier, and more particularly relates to a power amplifier without a transformer.

BACKGROUND OF THE INVENTION

For circuit safety, a conventional audio-frequency amplifier uses a transformer to reduce utility power voltage firstly, then uses a rectifier to rectify mentioned power into DC voltage, and transforms DC voltage to an amplifying circuit as a power source eventually. However, the conversion efficiency of normal small-scaled transformer is lower than 85% to cause the operation efficiency of the audio-frequency amplifier to be poor. In addition, although the audio-frequency amplifier applies small-scaled transformer, bulk and weight of the conventional audio-frequency amplifier are difficult to reduce effectively because the bulk and weight of the transformer and attached heat-dissipation apparatus account for the most portions compared with whole the audio-frequency amplifier. Otherwise, the operation power of the amplifying circuit is constrained by the voltage switching of the transformer thus making the conventional audio-frequency amplifier with high power (250 W) being difficult to achieve.

SUMMARY

The primary object of the present invention is to provide a power amplifier without a transformer. An amplifier enables the use of utility power rectified and filtered by a rectifier as power source directly without a transformer by using an audio isolator to isolate an audio-source input end and the amplifier. In addition, owing to the power amplifier of the present invention is thus operable at high power, the secondary object of the present invention is to protect the amplifier with a phase detector and a power protection controller to prevent the amplifier and an output apparatus from damage caused by excessive current.

A power amplifier without a transformer includes an audio isolator, a phase detector, a power protection controller, a rectifier and an amplifier. The audio isolator receives an audio-frequency signal and outputs an audio-frequency isolation signal, the phase detector receives a first AC utility power and a second AC utility power, wherein the phase detector is used for detecting potential level of the first AC utility power and the second AC utility power and outputting a phase comparison signal, the power protection controller comprises an input end, an output end and a first control unit, wherein the input end receives the first AC utility power and the second AC utility power, the first control unit connects to the phase detector for receiving the phase comparison signal, and the first control unit is controlled by the phase comparison signal for determining the output end whether to output the first AC utility power and the second AC utility power. The rectifier connects to the output end of the power protection controller for receiving the first AC utility power and the second AC utility power, wherein the rectifier outputs a DC voltage. The amplifier connects to the audio isolator and the rectifier, wherein the amplifier receives the audio-frequency isolation signal and uses the DC voltage outputted from the rectifier as power source, the amplifier is used to amplify the audio-frequency isolation signal and output an amplifying signal.

In the present invention, damage caused by AC short circuit is avoidable by using the audio isolator to isolate audio-source input end and the amplifier. Therefore, the amplifier enables to use utility power rectified and filtered by the rectifier as a power source directly without a transformer, thus increasing transformation efficiency of the power amplifier without a transformer and decreasing the bulk and weight of the whole circuit substantially.

DETAILED DESCRIPTION OF THE INVENTION

Figure 1:
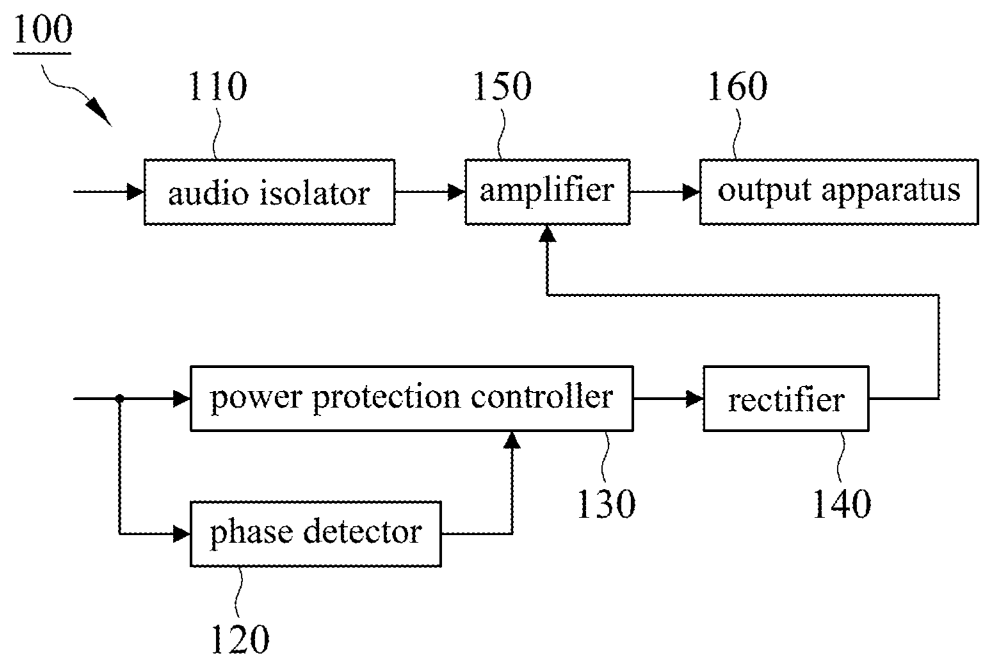
FIG. 1 is a function block diagram illustrating a power amplifier without a transformer in accordance with a first embodiment of the present invention.

With reference to FIG. 1, a power amplifier without a transformer 100 in accordance with a first embodiment of the present invention includes a audio isolator 110, a phase detector 120, a power protection controller 130, a rectifier 140, an amplifier 150 and an output apparatus 160, wherein the amplifier 150 is selected from A type, B type, AB type or D type amplifier, and the output apparatus 160 is a speaker.

Figure 2:
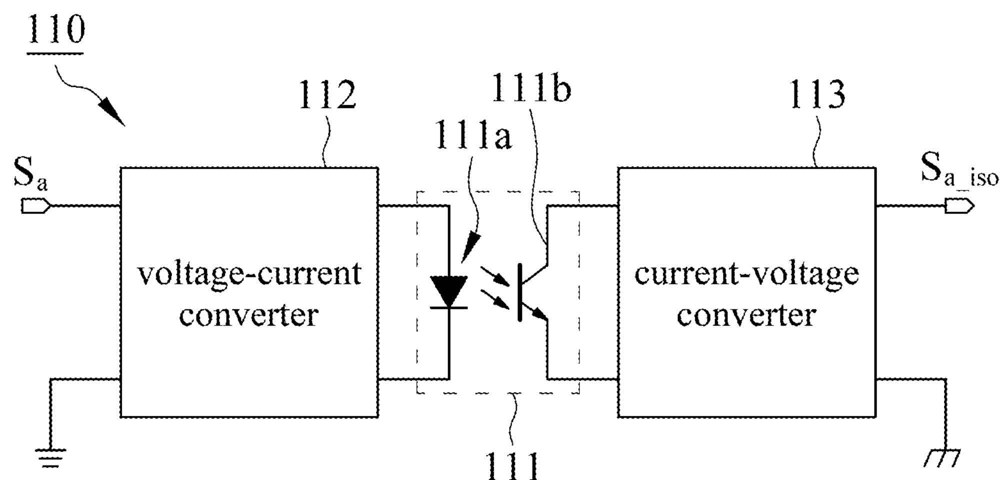
FIG. 2 is a diagram illustrating an audio isolator in accordance with the first embodiment of the present invention.

Referring to FIGS. 1 and 2, the audio isolator 110 receives an audio-frequency signal $S_a$ and outputs an audio-frequency isolation signal $S_{a\_iso}$ to the amplifier 150. With reference to FIG. 2, in this embodiment, the audio isolator 110 comprises an optocoupler 111 comprising an input terminal 111*a* and an output terminal 111*b*, a voltage-current converter 112 and a current-voltage converter 113, wherein the voltage-current converter 112 connects to the input terminal 111*a* of the optocoupler 111, and the input terminal 111*a* of the optocoupler 111 receives the audio-frequency signal $S_a$ via the voltage-current converter 112. The voltage-current converter 112 is used for converting the audio-frequency signal $S_a$ from voltage signal to current signal. The input terminal 111*a* is a light emitting diode which controlled by the audio-frequency signal $S_a$, and the output terminal 111_b_ is an optical receiver used for receiving the light source emitted from the light emitting diode and outputting the audio-frequency isolation signal $S_{a\_iso}$ that is current signal. The current-voltage converter 113 connects to the output terminal 111_b_ of the optocoupler 111, and the optocoupler 111 outputs the audio-frequency isolation signal $S_{a\_iso}$ via the current-voltage converter 113. The current-voltage converter 113 is used for converting the audio-frequency isolation signal $S_{a\_iso}$ from current signal to voltage signal and outputting to the amplifier 150. Owing to the input terminal 111_a_ and the output terminal 111_b_ of the optocoupler 111 are not commonly grounded, the amplifier 150 and audio-source input end are able to be totally isolated from each other to avoid an AC short-circuit. Thus, the amplifier 150 of the present invention enables the use of utility power after rectifying and filtering as a power source directly without decreasing utility power voltage with a transformer for increasing operation efficiency of the power amplifier without a transformer 100 substantially, wherein the operation frequency of the audio isolator 110 is between 5 Hz and 100 KHz.

Figure 3:
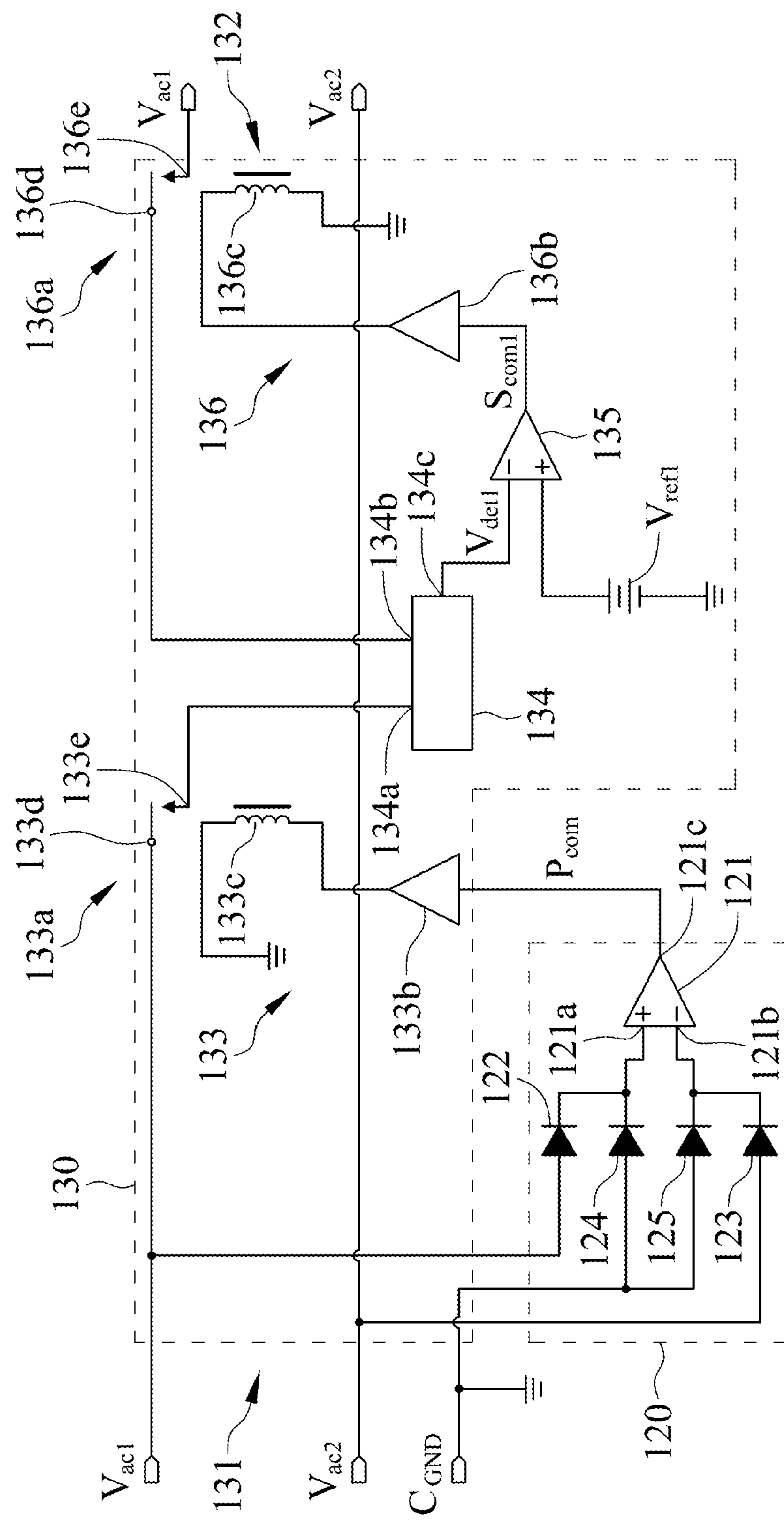
FIG. 3 is a circuit diagram illustrating a phase detector and a power protection controller in accordance with the first embodiment of the present invention.

The amplifier 150 is applicable in high power because it connects to utility power directly without a transformer, so the amplifier 150 protection is necessary because the amplifier 150 may receive excessive current. Referring to FIGS. 1 and 3, Power supplied from utility power is categorized into live wire, neutral wire and earth wire, and power switch of the power amplifier without a transformer 100 is put on live wire. The power amplifier without a transformer 100 is able to totally isolate with utility power when the power switch is off. Nevertheless, if an electrician accidentally installs the live wire and neutral wire of home socket incorrectly, the power amplifier without a transformer 100 in the off state will still connect to the live wire with high potential, thus resulting in device damage or electrician injury because of leakage. Accordingly, the present invention uses the phase detector 120 to sense the utility power phase. With reference to FIG. 3, the phase detector 120 receives a first AC utility power $V_{ac1}$ and a second AC utility power $V_{ac2}$, wherein the phase detector 120 is used to detect potential level of the first AC utility power $V_{ac1}$ and the second AC utility power $V_{ac2}$, and outputs a phase comparison signal $P_{com}$ to indicate whether the installation of the live wire and neutral wire of utility power is correct. In this embodiment, the phase detector 120 comprises a first comparator 121 comprising a first positive terminal 121_a_, a first negative terminal 121_b_ and a first output terminal 121_c_, a first diode 122, a second diode 123, a third diode 124 and a fourth diode 125, wherein the first diode 122 and the third diode 124 connect to the first positive terminal 121_a_ of the first comparator 121, and the second diode 123 and the fourth diode 125 connect to the first negative terminal 121_b_ of the first comparator 121. The first positive terminal 121_a_ of the first comparator 121 receives the first AC utility power $V_{ac1}$ via the first diode 122 and connects to a utility power ground end $C_{GND}$ via the third diode 124, and the first negative terminal 121_b_ of the first comparator 121 receives the second AC utility power $V_{ac2}$ via the second diode 123 and connects to the utility power ground end $C_{GND}$ via the fourth diode 125 for comparing potential between the first AC utility power $V_{ac1}$ and the second AC utility power $V_{ac2}$ and outputting the phase comparison signal $P_{com}$ via the first output terminal 121_c_. The phase comparison signal $P_{com}$ outputted from the phase detector 120 will be at high potential when the potential of the first AC utility power $V_{ac1}$ higher than that of the second AC utility power $V_{ac2}$, which represents the live wire and neutral wire of utility power are installed correctly. On the contrary, the phase comparison signal $P_{com}$ outputted from the phase detector 120 will be at low potential when the potential of the first AC utility power $V_{ac1}$ is lower than that of the second AC utility power $V_{ac2}$, which represents that the live wire and neutral wire of utility power are installed incorrectly, and power circuit break protection is necessary.

With reference to FIG. 3, the power protection controller 130 comprises an input end 131, an output end 132 and a first control unit 133 connected between the input end 131 and the output end 132, wherein the input end 131 receives the first AC utility power $V_{ac1}$ and the second AC utility power $V_{ac2}$, and the first control unit 133 connects to the phase detector 120 for receiving the phase comparison signal $P_{com}$. The first control unit 133 is controlled by the phase comparison signal $P_{com}$ to determine whether the output end 132 outputs the first AC utility power $V_{ac1}$ and the second AC utility power $V_{ac2}$ or not. In this embodiment, the first control unit 133 comprises a first relay 133_a_ and a first buffer 133_b_, wherein the first relay 133_a_ comprises a first coil 133_c_, a first common end 133_d_ and a first output end 133_e_. One end of the first coil 133_c_ is grounded, the other end of the first coil 133_c_ connects to one end of the first buffer 133_b_, and the other end of the first buffer 133_b_ connects to the first output terminal 121_c_ of the first comparator 121. Accordingly, the first coil 133_c_ of the first relay 133_a_ receives the phase comparison signal $P_{com}$ via the first buffer 133_b_, wherein the phase comparison signal $P_{com}$ is used to control the first coil 133_c_ to make the first common end 133_d_ directly connected to the first output end 133_e_. In this embodiment, the first output end 133_e_ is a normally open terminal. The first output end 133_e_ is closed and directly connects to the first common end 133_d_ when the phase comparison signal $P_{com}$ is at high potential representing correct installation of the live wire and neutral wire. Thus, the first AC utility power $V_{ac1}$ is able to output via the first output end 133_e_ because the first common end 133_d_ receives the first AC utility power $V_{ac1}$. Comparatively, the first output end 133_e_ is opened and does not connect to the first common end 133_d_ to make the first AC utility power $V_{ac1}$ unable to pass the first common end 133_d_ when the phase comparison signal $P_{com}$, is at low potential representing incorrect installation of the live wire and neutral wire, so that phase detecting protection is achieved.

Referring to FIG. 3, in this embodiment, the power protection controller 130 comprises a first current detection unit 134, a second comparator 135 and a second control unit 136. The first current detection unit 134 comprises a first current input terminal 134_a_, a first current output terminal 134_b_ and a first detection voltage output terminal 134_c_, wherein the first current input terminal 134_a_ connects to the first output end 133_e_ of the first relay 133_a_ for receiving the first AC utility power $V_{ac1}$, the first current output terminal 134_b_ outputs the first AC utility power $V_{ac1}$, and the first detection voltage output terminal 134_c_ outputs a first detection voltage $V_{det1}$. In this embodiment, the first current detection unit 134 is a Hall device, and the first current detection 134 senses the current passed through the first current detection 134 and generates the mentioned first detection voltage $V_{det1}$ for detecting passed current level. The second comparator 135 receives and compares the first detection voltage $V_{det1}$ and a first reference voltage $V_{ref1}$ to output a first comparison signal $S_{com1}$, wherein the first reference voltage $V_{ref1}$ depends on the rated current of the circuit. The first comparison signal $S_{com1}$ outputted from the second comparator 135 will be at high potential when the first detection voltage $V_{det1}$ not higher than the first reference voltage $V_{ref1}$, which represents the current passed through the first current detection unit 134 is not higher than the rated current of the circuit. Oppositely, the first comparison signal $S_{com1}$ outputted from the second comparator 135 will be at low potential when the first detection voltage $V_{det1}$ is higher than the first reference voltage $V_{ref1}$, which represents the current passed through the first current detection unit 134 is higher than the rated current of the circuit. The second control unit 136 comprises a second relay 136*a* and a second buffer 136*b*, wherein the second relay 136*a* comprises a second coil 136*c*, a second common end 136*d* and a second output end 136*e*. One end of the second coil 136*c* is grounded, the other end of the second coil 136*c* connects to one end of the second buffer 136*b*, and the other end of the second buffer 136*b* connects to the second comparator 135, therefore the second coil 136*c* of the second relay 136*a* receives the first comparison signal $S_{com1}$ via the second buffer 136*b*. The first detection voltage $V_{det1}$ is used to control the second coil 136*c* for making the second common end 136*d* directly connected to the second output end 136*e*. In this embodiment, the second output end 136*e* is a normally-open terminal. The second output end 136*e* is closed and directly connects to the second common end 136*d* when the first comparison signal $S_{com1}$ is at high potential which represents the current passed through the first current detection unit 134 is not higher than the rated current of the circuit. Because the second common end 136*d* connects to the first current output terminal 134*b* for receiving the first AC utility power $V_{ac1}$, therefore, the first AC utility power $V_{ac1}$ enables to output via the second output end 136*e*. In addition, the second output end 136*e* connects to the output end 132 to make the first AC utility power $V_{ac1}$ outputting via the output end 132 for normal power supply. Oppositely, when the first comparison signal $S_{com1}$ is at low potential which represents the current passed through the first current detection unit 134 is higher than the rated current of the circuit, the second output end 136*e* is opened and not connect with the second common end 136*d* to make the first AC utility power $V_{ac1}$ unable to pass through the second relay 136*a*. Thus, device damage is avoidable while excessive current pass through the rectifier 140 and the amplifier 150, and current detecting protection is achieved.

Figure 4:
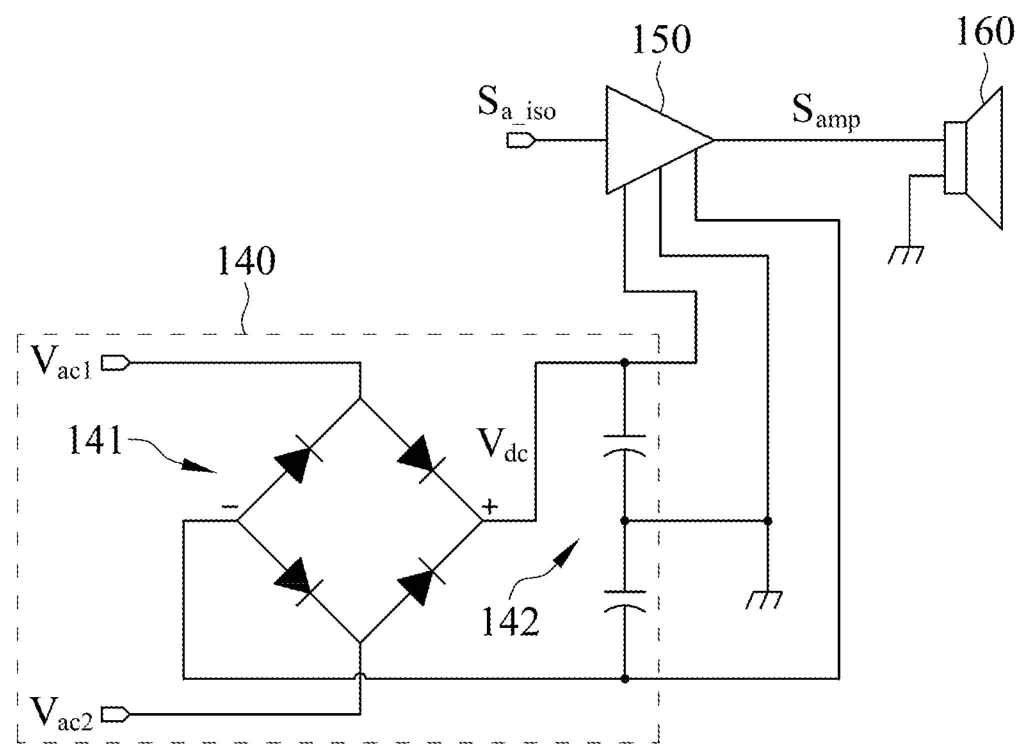
FIG. 4 is a circuit diagram illustrating a rectifier, an amplifier and an output apparatus in accordance with the first embodiment of the present invention.

With reference to FIGS. 1 and 4, the rectifier 140 connects to the output end 132 of the power protection controller 130 for receiving the first AC utility power $V_{ac1}$ and the second AC utility power $V_{ac2}$, and outputs a DC voltage $V_{dc}$ used as power source of the amplifier 150. Referring to FIG. 4, the rectifier 140 comprises a full bridge rectifier 141 and a filter capacitor 142, wherein the full bridge rectifier 141 connects to the output end 132 of the power protection controller 130 for receiving the first AC utility power $V_{ac1}$ and the second AC utility power $V_{ac2}$ and performing full-wave rectification to rectify the first AC utility power $V_{ac1}$ and the second AC utility power $V_{ac2}$ into DC power. The filter capacitor 142 connects to the full bridge rectifier 141 for filtering harmonic component of DC power, wherein the full bridge rectifier 141 outputs the DC voltage $V_{dc}$ to the amplifier 150 via the filter capacitor 142.

With reference to FIGS. 1 and 4, the amplifier 150 connects to the audio isolator 110 and the rectifier 140, and receives the audio-frequency isolation signal $S_{a\_iso}$ and the DC voltage $V_{dc}$. The amplifier 150 is used to amplify the audio-frequency isolation signal $S_{a\_iso}$ and output an amplifying signal $S_{amp}$ to the input apparatus 160 for audio play.

Damage caused by an AC short circuit is avoidable in the present invention by using the audio isolator 110 to isolate audio-source input end and the amplifier 150. Therefore, utility power after being rectified and filtered by the rectifier 140 is able to supply to the amplifier 150 without voltage reduction by a transformer for increasing transformation efficiency of the power amplifier without a transformer 100 and decreasing bulk and weight of the whole circuit substantially.

Figure 5:
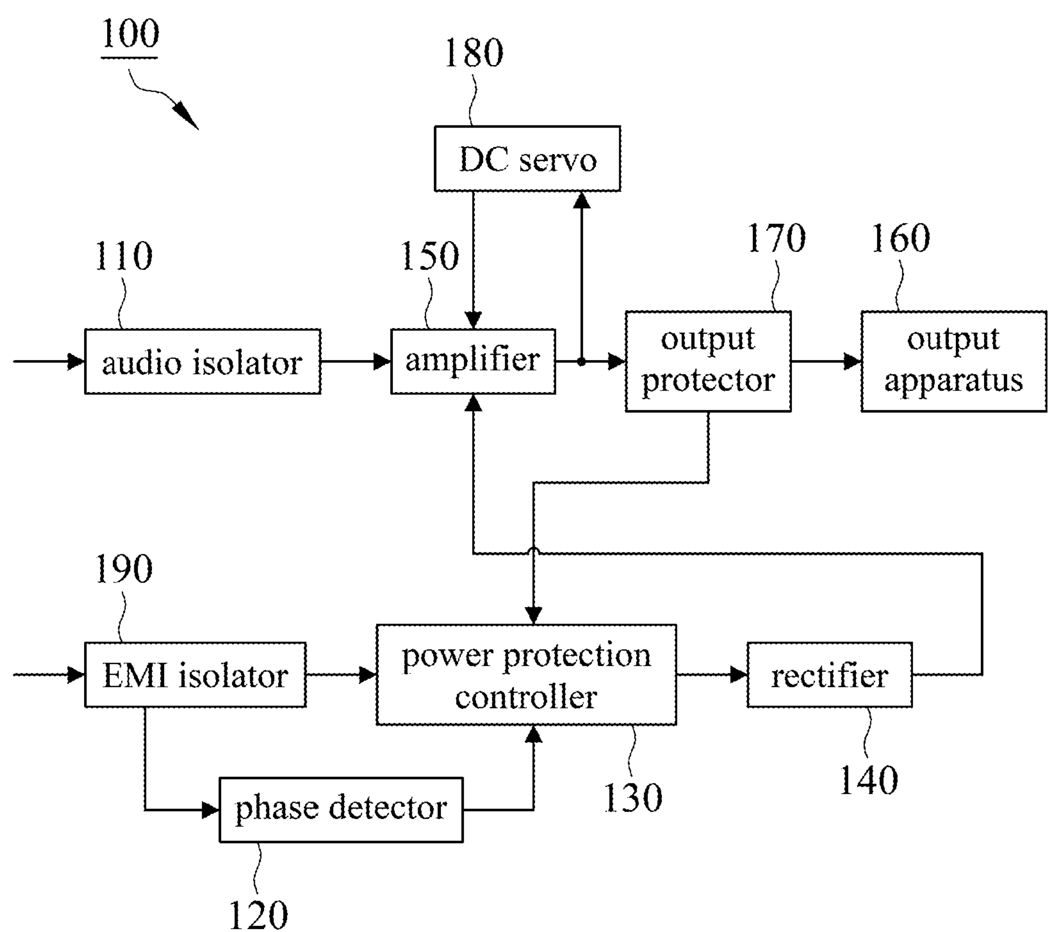
FIG. 5 is a function block diagram illustrating a power amplifier without a transformer in accordance with a second embodiment of the present invention.

A second embodiment of the present invention is illustrated in FIG. 5. The primary difference between the second embodiment and the first embodiment is the power amplifier without a transformer 100 of the second embodiment further includes an output protector 170, a DC servo 180 and an EMI (Electro-Magnetic Interference) isolator 190. The output protector 170 connects to the amplifier 150, the output apparatus 160 and the power protection controller 130, the DC servo 180 connects to the amplifier 150, and the EMI isolator 190 connects to the power protection controller 130 and the phase detector 120.

Figure 6:
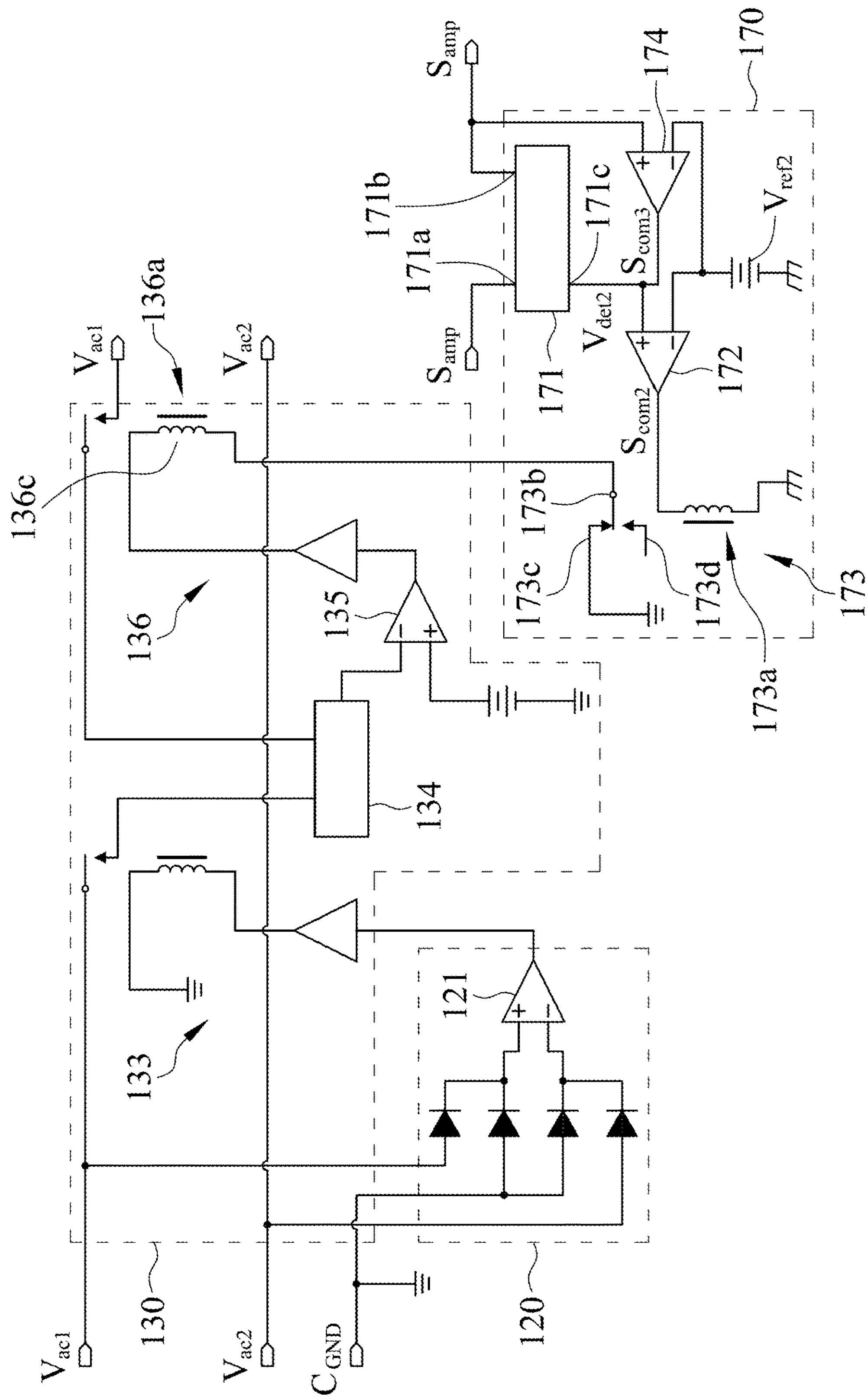
FIG. 6 is a circuit diagram illustrating a phase detector, a power protection controller and an output protector in accordance with the second embodiment of the present invention.

With reference to FIGS. 5 and 6, the output protector 170 comprises a second current detection unit 171, a third comparator 172, a third relay 173 and a fourth comparator 174. The second current detection unit 171 comprises a second current input terminal 171*a*, a second current output terminal 171*b* and a second detection voltage output terminal 171*c*, wherein the second current input terminal 171*a* connects to the amplifier 150 for receiving the amplifying signal $S_{amp}$, the second current output terminal 171*b* outputs the amplifying signal $S_{amp}$, and the second detection voltage input terminal 171*c* outputs a second detection voltage $V_{det2}$. In this embodiment, the second current detection unit 171 is a Hall device, and the second current detection unit 171 senses the current passed through the second current detection unit 171 and generates the mentioned second detection voltage $V_{det2}$ for detecting passed current level. The third comparator 172 receives and compares the second detection voltage $V_{det2}$ and a second reference voltage $V_{ref2}$ to output a second comparison signal $S_{com2}$, wherein the second reference voltage $V_{ref2}$ depends on the rated current of the circuit. The second comparison signal $S_{com2}$ outputted from the third comparator 172 will be at a low potential when the second detection voltage $V_{det2}$ is not higher than the second reference voltage $V_{ref12}$, which represents the current passed through the second current detection unit 171 is not higher than the rated current of the circuit. Oppositely, the second comparison signal $S_{com2}$ outputted from the third comparator 172 will be at a high potential when the second detection voltage $V_{det2}$ is higher than the second reference voltage $V_{ref2}$, which represents that the current passed through the second current detection unit 171 is higher than the rated current of the circuit.

Referring to FIG. 6, the fourth comparator 174 receives and compares the amplifying signal $S_{amp}$ and the second reference voltage $V_{ref2}$ to output a third comparison signal $S_{com3}$ to the third comparator 172, and the third comparator 172 compares the third comparison signal $S_{com3}$ and the second reference voltage $V_{ref2}$. The amplifying signal $S_{amp}$ higher than the second reference voltage $V_{ref2}$ makes the third comparison signal $S_{com3}$ at high potential when the amplifying signal $S_{amp}$ generates DC biasing and might cause the output apparatus 160 damage, and further makes the second comparison signal $S_{com2}$ outputted from the third comparator 172 at a high potential to active the third relay 173. The third relay 173 comprises a third coil 173*a*, a third common end 173*b*, a normally-closed end 173*c* and a normally-open end 173*d*, wherein one end of the third coil 173*a* receives the second comparison signal $S_{com2}$, the other end of the third coil 173*a* is grounded, and the third common end 173*b* connects to the second coil 136*c* of the second relay 136*a*. The second comparison signal $S_{com2}$ is used to control the third coil 173*a* for making the third common end 173*b* directly connect to the normally-closed end 173*c* or the normally-open end 173*d*. In this embodiment, the normally-closed end 173*c* is grounded, and the normally-open end 173*d* is floating.

With reference to FIG. 6, the third relay 173 will not be activated and the third common end 173*b* will be directly connected to the normally-closed end 173*c* for making the second coil 136*c* of the second relay 136*a* grounded and operate normally when the second comparison signal $S_{com2}$ outputted from the third comparator 172 is at a low potential, which represents the current passed through the second current detection unit 171 is not higher than the rated value and the amplifying signal $S_{amp}$ without DC bias. Oppositely, the third common end 173*b* of the third relay 173 will be switched to directly connect to the normally-open end 173*d* for making the second coil 136*c* of the second relay 136*a* floating and closed when the second comparison signal $S_{com2}$ outputted from the third comparator 172 is at a high potential, which represents the current passed through the second current detection unit 171 is higher than the rated value or the amplifying signal $S_{amp}$ with DC bias. Furthermore, the first AC utility power $V_{ac1}$ is not able to supply power to the rectifier 140 and the amplifier 150 via the second relay 136*a* for shutting down the amplifier 150 to prevent the output apparatus 160 from damage caused by the amplifying signal $S_{amp}$.

Figure 7:
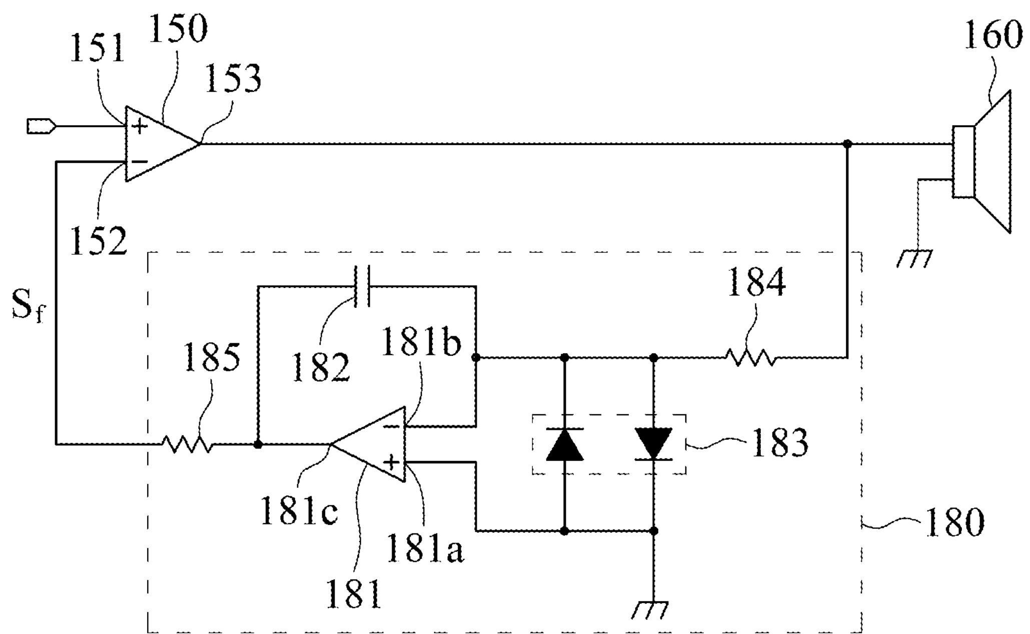
FIG. 7 is a circuit diagram illustrating a DC servo in accordance with the second embodiment of the present invention.

With reference to FIGS. 5 and 7, the DC servo 180 comprises an operation amplifier 181, a capacitor 182, a diode set 183, an input resistance 184 and an output resistance 185, wherein the operation amplifier 181 comprises a second positive terminal 181*a*, a second negative terminal 181*b* and a second output terminal 181*c*. One end of the capacitor 182 connects to the second negative terminal 181*b*, and the other end of the capacitor 182 connects to the second output terminal 181*c*. The diode set 183 connects to the second positive terminal 181*a* and the second negative terminal 181*b* of the operation amplifier 181. One end of the input resistance 184 connects to a signal output terminal 153 of the amplifier 150, and the other end of the input resistance 184 connects to the second negative terminal 181*b* for making the operation amplifier 181 receiving the amplifying signal $S_{amp}$ via the input resistance 184. One end of the output resistance 185 connects to the second output terminal 181*c*, and the other end of the output resistance 185 connects to a negative terminal 152 of the amplifier 150 for making the operation amplifier 181 outputting a feedback signal $S_f$ to the amplifier 150 via the output resistance 185. The operation amplifier 181 will output the feedback signal $S_f$ with negative DC to the negative terminal 152 of the amplifier 150 to adjust the amplifying signal $S_{amp}$ outputted from the amplifier 150 toward negative DC when the amplifier 150 outputs the amplifying signal $S_{amp}$ with positive DC. The amplifying signal $S_{amp}$ with zero DC is available by repeating the above-mentioned procedure to prevent the amplifying signal $S_{amp}$ from damaging the output apparatus 160 with an inductive load.

Figure 8:
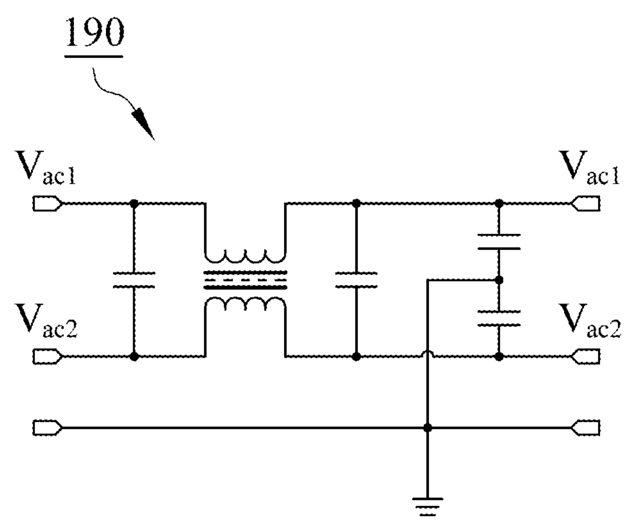
FIG. 8 is a circuit diagram illustrating an EMI isolator in accordance with the second embodiment of the present invention.

Referring to FIGS. 5 and 8, the EMI isolator 190 connected with the phase detector 120 and the power protection controller 130 isolates the first AC utility power $V_{ac1}$ and the second AC utility power $V_{ac2}$ by electro-magnetic interference, and the first AC utility power $V_{ac1}$ and the second AC utility power $V_{ac2}$ are transmitted to the phase detector 120 and the power protection controller 130 to make the amplifier 150 receive pure sine-like AC power for lowering the power interference level of the audio-frequency signal.

Figure 9:
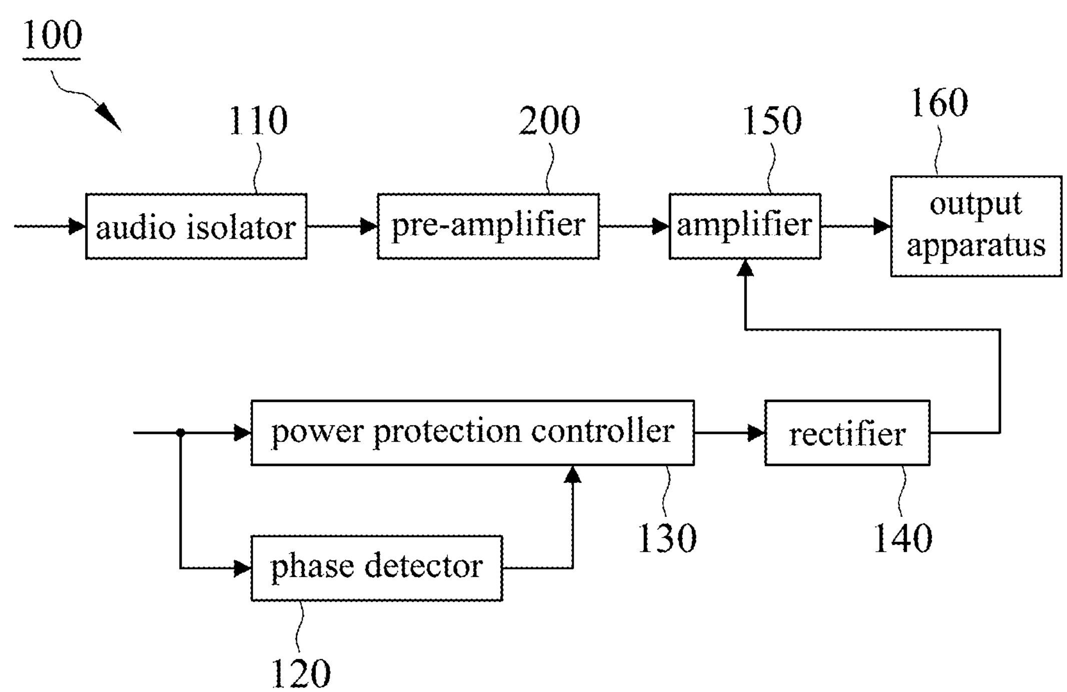
FIG. 9 is a function block diagram illustrating a power amplifier without a transformer in accordance with a third embodiment of the present invention.

A third embodiment of the present invention is illustrated in FIG. 9. The primary difference between the third embodiment and the first embodiment is the power amplifier without a transformer 100 further includes a pre-amplifier 200 in the third embodiment. The pre-amplifier 200 connects to the audio isolator 110 and the amplifier 150, wherein the pre-amplifier 200 is used to pre-amplify the audio-frequency isolation signal $S_{a\_iso}$ and output the audio-frequency isolation signal $S_{a\_iso}$ to the amplifier 150. The pre-amplifier 200 is selected from mobile Karaoke, audience broadcast system, video-conference system, mixer, equalizer, digital equalizer, bass-booster, preceding amplifier or decoder.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. A power amplifier without transformer includes:

an audio isolator for receiving an audio-frequency signal and outputting an audio-frequency isolation signal;

a phase detector for receiving a first AC utility power and a second AC utility power, wherein the phase detector is used for detecting potential level of the first AC utility power and the second AC utility power and outputting a phase comparison signal;

a power protection controller comprising an input end, an output end and a first control unit, wherein the input end receives the first AC utility power and the second AC utility power, the first control unit connects to the phase detector for receiving the phase comparison signal, and the first control unit is controlled by the phase comparison signal for determining the output end whether to output the first AC utility power and the second AC utility power;

a rectifier connected to the output end of the power protection controller for receiving the first AC utility power and the second AC utility power, wherein the rectifier outputs a DC voltage; and an amplifier connected to the audio isolator and the rectifier, wherein the amplifier receives the audio-frequency isolation signal and uses the DC voltage outputted from the rectifier as power source, the amplifier is used to amplify the audio-frequency isolation signal and output an amplifying signal.

2. The power amplifier without transformer in accordance with claim 1, wherein the audio isolator comprises an optocoupler having an input terminal and an output terminal, the input terminal receives the audio-frequency signal, the output terminal outputs the audio-frequency isolation signal, wherein the input terminal and the output terminal are not commonly grounded.

3. The power amplifier without transformer in accordance with claim 2, wherein the audio isolator comprises a voltage-current converter and a current-voltage converter, the voltage-current converter connects to the input terminal of the optocoupler, and the current-voltage converter connects to the output terminal of the optocoupler, wherein the optocoupler receives the audio-frequency signal via the voltage-current converter and outputs the audio-frequency isolation signal via the current-voltage converter.

4. The power amplifier without transformer in accordance with claim 1, wherein the phase detector comprises a first comparator having a first positive terminal, a first negative terminal and a first output terminal, the first positive terminal receives the first AC utility power, the first negative terminal receives the second AC utility power, and the first output terminal outputs the phase comparison signal.

5. The power amplifier without transformer in accordance with claim 4, wherein the phase detector comprises a first diode and a second diode, the first diode connects to the first positive terminal, and the second diode connects to the first negative terminal, wherein the first positive terminal of the first comparator receives the first AC utility power via the first diode, and the first negative terminal of the first comparator receives the second AC utility power via the second diode.

6. The power amplifier without transformer in accordance with claim 5, wherein the phase detector comprises a third diode and a fourth diode, the third diode connects to the first positive terminal, and the fourth diode connects to the first negative terminal, wherein the first positive terminal connects to a utility power ground terminal via the third diode, and the first negative terminal connects to the utility power ground terminal via the fourth diode.

7. The power amplifier without transformer in accordance with claim 5, wherein the first control unit of the power protection controller comprises a first relay having a first coil, a first common end and a first output end, the first coil receives the phase comparison signal, the first common end receives the first AC utility power, wherein the phase comparison signal is used to control the first coil for making the first common end shortly connected to the first output end.

8. The power amplifier without transformer in accordance with claim 6, wherein the first control unit of the power protection controller comprises a first relay having a first coil, a first common end and a first output end, the first coil receives the phase comparison signal, the first common end receives the first AC utility power, wherein the phase comparison signal is used to control the first coil for making the first common end shortly connected to the first output end.

9. The power amplifier without transformer in accordance with claim 7, wherein the power protection controller comprises a first current detection unit, a second comparator and a second control unit, the first current detection unit comprises a first current input terminal, a first current output terminal and a first detection voltage output terminal, wherein the first current input terminal connects to the first output end of the first relay for receiving the first AC utility power, the first current output terminal outputs the first AC utility power, the first detection voltage output terminal outputs a first detection voltage, the second comparator receives and compares the first detection voltage and a first reference voltage to output a first comparison signal, the second control unit comprises a second relay having a second coil, a second common end and a second output end connects to the output end, the second coil receives the first comparison signal, the second common end connects to the first current output terminal for receiving the first AC utility power, wherein the first detection voltage is used to control the second coil for making the second common end shortly connected to the second output end.

10. The power amplifier without transformer in accordance with claim 8, wherein the power protection controller comprises a first current detection unit, a second comparator and a second control unit, the first current detection unit comprises a first current input terminal, a first current output terminal and a first detection voltage output terminal, wherein the first current input terminal connects to THE first output end of the first relay for receiving the first AC utility power, the first current output terminal outputs the first AC utility power, the first detection voltage output terminal outputs a first detection voltage, the second comparator receives and compares the first detection voltage and a first reference voltage to output a first comparison signal, the second control unit comprises a second relay having a second coil, a second common end and a second output end connects to the output end, the second coil receives the first comparison signal, the second common end connects to the first current output terminal for receiving the first AC utility power, wherein the first detection voltage is used to control the second coil for making the second common end shortly connected to the second output end.

11. The power amplifier without transformer in accordance with claim 9, wherein the first control unit of the power protection controller comprises a first buffer, the second control unit comprises a second buffer, the first buffer connects to the first comparator and the first relay, the first coil of the first relay receives the phase comparison signal via the first buffer, the second buffer connects to the second comparator and the second relay, the second coil of the second relay receives the first comparison signal via the second buffer.

12. The power amplifier without transformer in accordance with claim 10, wherein the first control unit of the power protection controller comprises a first buffer, the second control unit comprises a second buffer, the first buffer connects to the first comparator and the first relay, the first coil of the first relay receives the phase comparison signal via the first buffer, the second buffer connects to the second comparator and the second relay, the second coil of the second relay receives the first comparison signal via the second buffer.

13. The power amplifier without transformer in accordance with claim 1, wherein the rectifier comprises a full bridge rectifier and a filter capacitor connects to the full bridge rectifier, the full bridge rectifier connects to the output end of the power protection controller for receiving the first AC utility power and the second AC utility power and outputs the DC voltage to the amplifier via the filter capacitor.

14. The power amplifier without transformer in accordance with claim 9 further includes an output protector comprising a second current detection unit, a third comparator and a third relay, the second current detection unit comprises a second current input terminal, a second current output terminal and a second detection voltage output terminal, wherein the second current input terminal connects to the amplifier for receiving the amplifying signal, the second current output terminal outputs the amplifying signal, and the second detection voltage output terminal outputs a second detection voltage, wherein the third comparator receives and compares the second detection voltage and a second reference voltage to output a second comparison signal, the third relay comprises a third coil, a third common end, a normally-closed end and a normally-open end, the third coil receives the second comparison signal, the third common end connects to the second coil of the second relay, wherein the second comparison signal is used to control the third coil for making the third common end directly connect to the normally-closed end or the normally-open end.

15. The power amplifier without transformer in accordance with claim 10 further includes an output protector comprising a second current detection unit, a third comparator and a third relay, the second current detection unit comprises a second current input terminal, a second current output terminal and a second detection voltage output terminal, wherein the second current input terminal connects to the amplifier for receiving the amplifying signal, the second current output terminal outputs the amplifying signal, and the second detection voltage output terminal outputs a second detection voltage, wherein the third comparator receives and compares the second detection voltage and a second reference voltage to output a second comparison signal, the third relay comprises a third coil, a third common end, a normally-closed end and a normally-open end, the third coil receives the second comparison signal, the third common end connects to the second coil of the second relay, wherein the second comparison signal is used to control the third coil for making the third common end directly connect to the normally-closed end or the normally-open end.

16. The power amplifier without transformer in accordance with claim 14, wherein the output protector comprises a fourth comparator, the fourth comparator receives and compares the amplifying signal and the second reference voltage to output a third comparison signal to the third comparator, and the third comparator compares the third comparison signal with the second reference voltage.

17. The power amplifier without transformer in accordance with claim 1 further includes a DC servo comprising an operation amplifier, a capacitor, a diode set, an input resistance and an output resistance, wherein the operation amplifier comprises a second positive terminal, a second negative terminal and a second output terminal, wherein one end of the capacitor connects to the second negative terminal, and the other end of the capacitor connects to the second output terminal, wherein the diode set connects to the second positive terminal and the second negative terminal of the operation amplifier, wherein one end of the input resistance connects to a signal output terminal of the amplifier, and the other end of the input resistance connects to the second negative terminal for making the operation amplifier receiving the amplifying signal via the input resistance, wherein one end of the output resistance connects to the second output terminal, and the other end of the output resistance connects to a negative terminal of the amplifier for making the operation amplifier outputting a feedback signal to the amplifier via the output resistance.

18. The power amplifier without transformer in accordance with claim 1 further includes a pre-amplifier connected with the audio isolator and the amplifier, wherein the pre-amplifier is used to pre-amplify the audio-frequency isolation signal and output the audio-frequency isolation signal to the amplifier.

19. The power amplifier without transformer in accordance with claim 1 further includes an EMI isolator connected with the phase detector and the power protection controller, wherein the phase detector and the power protection controller receive the first AC utility power and the second AC utility power via the EMI isolator.

20. The power amplifier without transformer in accordance with claim 1, wherein operation frequency of the audio isolator is between 5 Hz and 100 KHz.

* * * * *